United States Patent [19]

Sugihara et al.

[11] Patent Number: 5,077,269
[45] Date of Patent: Dec. 31, 1991

[54] SPUTTERING TARGET USED FOR FORMING QUINARY SUPERCONDUCTIVE OXIDE

[75] Inventors: Tadashi Sugihara; Yukihiro Ohuchi; Takuo Takeshita, all of Saitama, Japan

[73] Assignee: Mitsubishi Metal Corporation, Tokyo, Japan

[21] Appl. No.: 363,011

[22] Filed: Jun. 8, 1989

[30] Foreign Application Priority Data

Dec. 7, 1988 [JP] Japan .................................. 63-309661
Dec. 7, 1988 [JP] Japan .................................. 63-309662

[51] Int. Cl.$^5$ ........................................... H01L 39/12
[52] U.S. Cl. ..................................... 505/1; 75/234; 204/192.24; 204/298.13; 419/19; 505/731
[58] Field of Search ................... 505/731; 204/192.24, 204/298 TC, 298 B; 419/75; 75/234

[56] References Cited

U.S. PATENT DOCUMENTS 4,866,032  9/1989  Fujimori et al. ......................... 505/1
4,968,665  11/1990  Ohuchi et al. ......................... 505/1

FOREIGN PATENT DOCUMENTS 1004466  1/1984  Japan .............................. 204/192.24
1203219  2/1989  Japan .

OTHER PUBLICATIONS

Ramesh, "New Modulated Structure in a Pb-Doped . . . ", Appl. Phys. Lett., vol. 53 (22), Nov. 28, 1988, pp. 2220-2222.
Yamada, "Pb Introduction to the High-Tc Superconductor Bi-SrCa-Cu-O", Jap. Jnl. Appl. Phys., vol. 27(6), Jun. 1988, pp. L996-L998.
Johs, "Preparation of High Tc Tl-Ba-Ca-Cu-O Thin Films . . . ", Appl. Phys. Lett. 54(18), May 1, 1989, pp. 1810-1811.
Ohkuma, "Preparation of Y-Ba-Cu-O Thin Films by Rf. Mag. Sputtering", Jap. Jnl. Appl. Phys., vol. 26(9), Sept. 1987, pp. L1484-L1485.
Michikami, "Synthesis of Y-Ba-Cu-O Thin Films on Sapphire Substrates . . . ", Jap. Jnl. Appl. Phys., vol. 26(6), Jun. 1987, pp. L1199-L1201.
Akoh, "Thickness Dependence of Superconductivity in Rf-Sputtered Y-Ba-Cu-O . . . ", Appl. Phys. Lett. 52(20), May 16, 1988, pp. 1732-1734.
Asano, "High Tc Y-Ba-Cu-O Thin Films Prepared by . . . Sputtering", Jap. Jnl. Appl. Phys. vol. 26(7), July 1987, pp. L1221-L1222.
Qiu, "Formation of Tl-Ba-Ca-Cu-O Films by Diffusion of Tl . . . ", Appl. Phys. Lett., 53(12), Sept. 19, 1988, pp. 1122-1124.
Komuro, "Structures and Superconducting Properties of Y-Ba-Cu-O Sputtered Films", Jap. Jnl. Appl. Phys., vol. 26(11), Nov. 1987, pp. L1967-L1909.
Aida, "Preparation of $YBa_2Cu_3O_{7-x}$ Superconducting Thin Films by . . . Sputtering", Jap. Jnl. Appl. Phys., vol. 26(9), Sept. 1987, pp. L1489-L1491.
Gurvitch, "Preparation and Substrate Reactions of Superconducting Y-Ba-Cu-O Films", Appl. Phys. Lett., 51(13), Sept. 28, 1987, pp. 1027-1029.
Gross, "Spatially resolved Observation of the Critical Current . . . ", Nature, vol. 332, Apr. 28, 1988, pp. 818-819.
Nakao, "Magnetron Sputtering of Bi-Ca-Sr-Cu-O Thin Films . . . ", Jap. Jnl. Appl. Phys., vol. 27(3), mar. 1988, pp. L378-L380.
Koinuma, "Preparation of High-Tc Bi-Sr-Ca-Cu-O Superconducting . . . ", Jap. Jnl. Appl. Phys., vol. 27(3), Mar. 1988, pp. L376-L377.
Park, "Effect of Uniaxial Strain on . . . Thin Y-Ba$_2$-Cu$_{Ox}$ Film", Mat. Res. Soc. Symp. Proc. vol. 99, Nov.--Dec. 1987, pp. 685-688.
Kang, "Preparation of Superconducting $YBa_2Cu_3O_{7-x}$ Films . . . ", Ext. Abst.: High Temp. Super. (MRS), Apr. 5-9, 1988, pp. 209-210.

Primary Examiner—Paul Lieberman
Assistant Examiner—John Boyd
Attorney, Agent, or Firm—Sughrue, Mion, Zinn Macpeak & Seas

[57] ABSTRACT

A target used for forming a thin film of a quinary superconductive oxide contains metal copper ranging between about 8% and about 40% by volume dispersed into a quaternary or a quinary complex oxide, and the metal copper improves the thermal conductivity and the electrical conductivity of the target, so that cracks are less liable to take place in the target and the target is applicable to a d.c. sputtering system, thereby decreasing the production cost of the thin film.

2 Claims, No Drawings

SPUTTERING TARGET USED FOR FORMING QUINARY SUPERCONDUCTIVE OXIDE

FIELD OF THE INVENTION

This invention relates to a target used in a sputtering system and, more particularly, to a target used for a superconductive film of a quinary superconductive oxide.

BACKGROUND OF THE INVENTION

Many attempts are made for depositing a quinary superconductive oxide in such as, for example, the thallium-barium-calcium-copper-oxide (Tl-Ba-Ca-Cu-O) system or the bismuth-strontium-calcium-copper-oxide (Bi-Sr-Ca-Cu-O) system on an insulating substrate. The sputtering technique is an attractive candidate for the formation of the quinary superconductive oxide, and, for this reason, various targets are proposed for use in the sputtering system.

One of the formation processes starts with preparation of raw powders of thallium oxide, barium carbonate, calcium carbonate and copper oxide and these powders are about 10 microns in average diameter. The raw powders are regulated to a predetermined proportion, and, then, mixed to produce a mixture. The mixture is calcined in a sealed vessel at 600 degrees to 700 degrees in centigrade for a certain time period, and the calcined product is pulverized into a powder. The calcining stage and the pulverizing stage are repeated twice or three times, thereby forming a powder of a superconductive oxide in the thallium-strontium-calcium-copper-oxide system. The powder of the super-conductive oxide is formed into a target by using a hot-pressing technique. Namely, the powder is pressurized at 100 kgf/cm$^2$ to 200 kgf/cm$^2$ and subjected to a heat treatment in a vacuum ambient less than 10$^{-2}$ torr at 800 degrees to 900 degrees in centigrade for a time period ranging from an hour to four hours. The target thus formed substantially consists of a quinary oxide in the thallium-barium-calcium-copper-oxide system or a composite of the quinary oxide and copper oxide equal to o less than 20 % in volume. The reason why the copper oxide is intentionally included in the target is that the composition of the target is hardly transferred to the deposited film under certain sputtering conditions and, for this reason, the copper oxide is previously supplemented to the powder of the superconductive oxide.

The formation of the target of the quinary superconductive oxide in bismuth-strontium-calcium-copper system traces the similar process sequence to that described above. Namely, a mixture is prepared from raw powders of bismuth oxide, strontium carbonate, calcium carbonate and copper oxide which are about 10 microns in average diameter. A powder of lead oxide may be further mixed into the mixture. The mixture is calcined at 700 degrees and 800 degrees in centigrade for a certain time period, and the calcined product is pulverized into a powder. These are repeated twice or three times, thereby finally producing a powder of superconductive oxide in the bismuth-strontium-calcium-copper-oxide system. With the super-conductive oxide powder, a target is formed by using a hot-pressing technique in the aforementioned conditions. The target thus produced is substantially composed of a superconductive oxide in either bismuth-strontium-calcium-copper or bismuth-strontium-calcium-copper-oxide system. If the excess copper oxide is previously into the mixture so as to adjust the composition of the deposited oxide film, the target contains the copper oxide equal to or less than 20 % by volume.

However, a problem is encountered in the prior art target in production of cracks due to thermal stress. This is because of the fact that the prior art target is small in thermal conductivity, and, for this reason, a large difference in temperature takes place between both sides of the target in the service conditions. The large difference in temperature results in thermal stress which is causative of the cracks. The cracks deteriorates the production yield and, accordingly, increases the production cost of the deposited film.

The prior art target is further small in electric conductivity, so that the prior art target is merely applicable to an expensive r.f. sputtering system. This also increases the production cost of the deposited film.

Another problem inherent in the prior art target is brittleness. The operator is requested to carefully handle the brittle target, however, the operator sometimes makes human errors. This results in destruction of the target, and, for this reason, the production cost of the deposited film further tends to be increased.

SUMMARY OF THE INVENTION

It is therefore an important object of the present invention to provide a target large in thermal conductivity as well as electrical conductivity.

It is also a important object of the present invention to provide a target which is large in mechanical strength and, accordingly, less liable to be destroyed.

To accomplish these objects, the present invention proposes to disperse metal copper into a quaternary and/or quinary oxide used for formation of a superconductive film. The metal copper is conducive to improvement in thermal conductivity, electric conductivity as well as in mechanical strength.

In accordance with one aspect of the present invention, there is provided a target used in a sputtering system for forming a thin film of a quinary superconductive oxide, comprising a quaternary complex oxide in one of the thallium-barium-calcium-copper-oxide system and the bismuth-strontium-calcium-copper-oxide system containing the elements of said quinary superconductive oxide except for copper and metal copper ranging between about 8 % and about 40 % by volume, wherein the metal copper is dispersed into the quaternary complex oxide throughout the target so as to mixed into the quaternary complex oxide.

In accordance with another aspect of the present invention, there is provided a target used in a sputtering system for forming a thin film of a quinary superconductive oxide in one of the thallium-barium-calcium-copper-oxide system and the bismuth-strontium-calcium-copper-oxide system, comprising a quinary complex oxide containing all of the elements of the quinary superconductive oxide throughout the target so as to be mixed into the quinary complex oxide and metal copper ranging between about 8 % and about 40 % by volume, wherein said metal copper is dispersed into said quinary complex oxide.

The copper content is fallen within the range from about 8 % to about 40 % by volume. This is because of the fact that any copper content less than 8 % can not achieve an effective cooling efficiency for restriction of the difference in temperature between both sides, a low electric resistivity acceptable to a current d.c. sputtering system, and a flexural strength preventing the target from destruction. If the copper content is increased over 40 % by volume, the copper is too much to form a complex oxide with the composition desirable for achievement of the superconductivity. The problem in the excess copper content is especially eminent in the presence of the copper oxide contained in the target.

The target may contain both quaternary and quinary complex oxides and is allowed to contain a copper oxide equal to or less than 20 % by volume.

The quaternary complex oxide may be in either thallium-barium-calcium-oxide or bismuth-strontium-calcium-oxide system, and the quinary complex oxide may be in either thallium-barium-calcium-copper-oxide or bismuth-strontium-calcium-copper-system.

DESCRIPTION OF THE PREFERRED EMBODIMENTS

Thallium-Barium-Calcium-Copper-Oxide System

In order to produce a target according to the present invention, it is necessary to prepare various mixtures in the thallium-barium-calcium-oxide system and the thallium-barium-calcium-copper-oxide system the compositions of which are indicated in Table 1. Each of the mixtures is equal to or less than five microns in average diameter, and referred to as specimen designated by one of the numerals 1 to 11.

Each of the mixtures are shaped into a disk configuration by using a vacuum hot-pressing technique, and the disk-shaped target is about 50 millimeters in diameter and about 4 millimeters in thickness. The hot pressing is carried out in a vacuum ambient of about $10^{-3}$ torr at about 750 degrees in centigrade for about three hours, and the mixture is pressurized at about 150 kgf/cm$^2$.

Other ingredient mixtures (which respectively consist of specimens 12 to 17) are prepared for the sake of comparison The mixtures or the specimens 12 to 15 are out of the scope of the present invention due to the copper contents, and these mixtures are also shaped into the disk configuration by using the vacuum hot pressing technique. The conditions of the hot pressing are similar to those for the specimens 1 to 11. The specimens 16 and 17 are also out of the scope of the present invention, because no metal copper is contained therein. These mixtures without any metal copper are hot pressed in the similar ambient with the exception that the vacuum ambient is heated to about 850 degrees in centigrade.

The thermal conductivity, the resistivity and the flexural strength are measured for evaluation of all of the targets formed of the specimens 1 to 17. The results are indicated in Table 2.

All of the targets are successively installed in a d.c. sputtering system, and, then, subjected to bombardments of argon ions, respectively. Additionally, an r.f. magnetron sputtering system is alternatively usable for the deposition of the thin films. Thus, thin films are deposited to a thickness of about 2 microns on respective substrates. The sputtering conditions are as follows:

Vacuum; $10^{-4}$ torr to $10^{-1}$ torr,
Gas; argon, (gaseous mixture of argon and oxygen (5 % to 50 %) are available)
Power; 100 watts to 600 watts,
Substrate; magnesium oxide (MgO) substrates having rectangular top surface measuring about 100 millimeters × 100 millimeters,
Heat application to the substrates; about 650 degrees in centigrade (no heat application is acceptable)
Distance between the target and the substrate; about 50 millimeters to about 130 millimeters.

After the deposition of the thin films, the substrates are placed in a thallium (Tl) ambient of about 840 degrees in centigrade for about 50 hours to carry out a heat treatment. After the heat treatment, the substrates are gradually cooled, and, thereafter, critical temperatures Tc ( or temperatures of zero resistivity) are respectively measured for all of the thin films by using the four prove method.

The measured critical temperatures Tc are also indicated in Table 2. In Table 2, the target respectively produced by the specimens 1 to 17 and the thin films deposited by using the respective targets are labeled by the same numerals used for indication of the specimens.

TABLE 1

| | Mixture (% by volume) | | | | | | | |
|---|---|---|---|---|---|---|---|---|
| | Tl—Ba—Ca—(Cu)—O system | | | | | | | |
| spec-imen | percentage by weight | | | | | | | |
| | Tl | Ba | Ca | Cu | O | | CuO | Cu |
| 1 | 46.0 | 30.9 | 10.4 | — | residual | residual | — | 17.2 |
| 2 | 46.0 | 30.9 | 10.4 | — | residual | residual | — | 34.2 |
| 3 | 29.1 | 39.0 | 17.1 | — | residual | residual | 17.1 | 9.6 |
| 4 | 29.1 | 39.0 | 17.1 | — | residual | residual | 4.3 | 18.0 |
| 5 | 36.7 | 24.6 | 7.2 | 17.1 | residual | residual | — | 8.5 |
| 6 | 36.7 | 24.6 | 7.2 | 17.1 | residual | residual | — | 12.3 |
| 7 | 39.5 | 26.5 | 7.8 | 12.3 | residual | residual | 3.2 | •10.8 |
| 8 | 39.5 | 26.5 | 7.8 | 12.3 | residual | residual | 11.8 | 15.7 |
| 9 | 46.0 | 30.9 | 10.4 | — | residual | 28.1 | — | 37.4 |
| | 29.1 | 39.0 | 17.1 | — | residual | residual | | |
| 10 | 29.1 | 39.0 | 17.1 | — | residual | 39.1 | 6.8 | 15.1 |
| | 36.7 | 24.6 | 7.2 | 17.1 | residual | residual | | |
| 11 | 36.7 | 24.6 | 7.2 | 17.1 | residual | 43.0 | 12.5 | 9.2 |
| | 39.5 | 26.5 | 7.8 | 12.3 | residual | residual | | |
| 12 | 46.0 | 30.9 | 10.4 | — | residual | residual | — | 43.2 |
| 13 | 29.1 | 39.0 | 17.1 | — | residual | residual | 17.1 | 6.5 |
| 14 | 36.7 | 24.6 | 7.2 | 17.1 | residual | residual | — | 6.1 |
| 15 | 39.5 | 26.5 | 7.8 | 12.3 | residual | residual | 3.2 | 44.1 |
| 16 | 36.7 | 24.6 | 7.2 | 17.1 | residual | residual | — | — |
| 17 | 36.7 | 24.6 | 7.2 | 17.1 | residual | residual | 6.8 | — |

TABLE 2

| Specimen | T.C. (Cal) cm · sec · degree | Resistivity (ohm · cm) | Flexural strength (Kg/cm$^2$) | Critical Temp. (Kelvin) |
|---|---|---|---|---|
| 1 | 0.25 | 8 × 10$^{-6}$ | 130 | 120 |
| 2 | 0.30 | 3 × 10$^{-6}$ | 150 | 80 |
| 3 | 0.10 | 15 × 10$^{-6}$ | 146 | 115 |
| 4 | 0.25 | 7 × 10$^{-6}$ | 135 | 113 |
| 5 | 0.08 | 20 × 10$^{-6}$ | 121 | 118 |
| 6 | 0.11 | 14 × 10$^{-6}$ | 143 | 116 |
| 7 | 0.11 | 15 × 10$^{-6}$ | 137 | 121 |
| 8 | 0.20 | 10 × 10$^{-6}$ | 156 | 87 |
| 9 | 0.35 | 2 × 10$^{-6}$ | 145 | 103 |
| 10 | 0.18 | 8 × 10$^{-6}$ | 137 | 94 |
| 11 | 0.10 | 18 × 10$^{-6}$ | 131 | 89 |
| 12 | 0.45 | 2 × 10$^{-6}$ | 142 | 60 |
| 13 | 0.01 | 6 × 10$^{-3}$ | 67 | 108 |
| 14 | 0.01 | 5 × 10$^{-3}$ | 70 | 105 |
| 15 | 0.45 | 2 × 10$^{-6}$ | 140 | 58 |
| 16 | 0.01 | 3 | 70 | 88 |
| 17 | 0.01 | 5 | 70 | 114 |

T.C. stands for "thermal conductivity", and "degree" is in centigrade.

As will be understood from Table 2, the targets produced of the mixtures according to the present invention are improved in the thermal conductivity, the resistivity and the flexural strength in comparison with the targets produced of the mixtures out of the scope of the present invention. The targets of the present invention are thus increased in the thermal conductivity, so that the targets are effectively cooled off so as to prevent the targets from production of the cracks. This results in prolonging the service time of each target, which in turn results in reduction of the production cost of the thin film. The resistivity is low enough to use the d.c. sputtering system, and this also is conducive to reduction of the production cost. The large flexural strength enhances the operability of each target, and the target is less liable to break. This further improves the production cost.

Comparing targets produced of the specimens 13 and 14 with the targets of the present invention, it is understood that no improvement is achieved in the thermal conductivity, the resistivity and the flexural strength. The targets produced of the specimens 12 and 15 suffer from the low critical temperatures, respectively. It is considered that the excess copper restricts the formation of the superconductive film.

Bismuth-Strontium-Calcium-Copper System

The process sequence for formation of the targets according to the present invention starts with preparation of various mixtures in the bismuth-strontium-calcium-oxide system and the bismuth-strontium-calcium-copper system the compositions of which are indicated in Table 3. Each of the mixtures is equal to or less than five microns in average diameter and referred to as specimen designated by one of the numerals 1 to 11.

Each of the mixtures are shaped into a disk configuration by using a vacuum hot-pressing technique, and the disk-shaped target is about 50 millimeters in diameter and about 4 millimeters in thickness. The hot pressing is carried out in a vacuum ambient of about $10^{-3}$ torr at about 750 degrees in centigrade for about three hours, and the mixture is pressurized at about 150 kgf/cm$^2$.

Other ingredient mixtures (which respectively consist o specimens 12 to 17) are prepared for the sake of comparison. The mixtures or the specimens 12 to 15 are out of the scope of the present invention due to the copper contents, and these mixtures are also shaped into the disk configuration by using the vacuum hot pressing technique. The conditions of the hot pressing are similar to those for the specimens 1 to 11. The specimens 16 and 17 are also out of the scope of the present invention, because no metal copper is contained therein. These mixtures without any metal copper are hot pressed in the similar ambient with the exception that the vacuum ambient is heated to about 850 degrees in centigrade.

The thermal conductivity, the resistivity and the flexural strength are measured for evaluation of all of the targets formed of the specimens 1 to 17. The results are indicated in Table 4.

All of the targets are successively installed in a d.c. sputtering system, and, then, subjected to bombardments of argon ions, respectively. Additionally, an r.f. magnetron sputtering system is alternatively usable for the deposition of the thin films. Thus, thin films are deposited to a thickness of about 2 microns on respective substrates. The sputtering conditions are as follows:

Vacuum; $10^{-4}$ torr to $10^{-1}$ torr,
Gas; argon, (gaseous mixture of argon and oxygen (5 % to 50 %) are available)
Power; 100 watts to 600 watts,
Substrate; magnesium oxide (MgO) substrates having rectangular top surface measuring about 10 millimeters × 10 millimeters,
Heat application to the substrates; about 700 degrees in centigrade, (no heat application is acceptable)
Distance between the target and the substrate; about 50 millimeters to about 130 millimeters.

After the deposition of the thin films, the substrates are placed in the atmospheric ambient at 850 degrees in centigrade for about 30 hours to carry out a heat treatment. After the heat treatment, the substrates are gradually cooled, and, thereafter, critical temperatures Tc ( or temperatures of zero resistivity) are respectively measured for all of the thin films by using the four prove method.

The measured critical temperatures Tc are also indicated in Table 4. In Table 2, the target respectively produced by the specimens 1 to 17 and the thin films deposited by using the respective targets are labeled by the same numerals used for indication of the specimens.

TABLE 3

| | composition (by volume) | | | | | | | | |
|---|---|---|---|---|---|---|---|---|---|
| | Bi—Sr—Ca—(Cu)—O system | | | | | | | | |
| | percentage by weight | | | | | | | | |
| specimen | Bi | Pb | Sr | Ca | Cu | O | | CuO | Cu |
| 1 | 53.2 | — | 22.3 | 10.2 | — | residual | residual | — | 17.8 |
| 2 | 53.2 | — | 22.3 | 10.2 | — | residual | residual | — | 30.3 |
| 3 | 58.4 | — | 16.3 | 11.2 | — | residual | residual | 18.8 | 8.5 |
| 4 | 58.4 | — | 16.3 | 11.2 | — | residual | residual | 7.3 | 17.8 |
| 5 | 38.7 | 9.6 | 20.3 | 9.3 | 7.4 | residual | residual | — | 9.5 |
| 6 | 38.7 | 9.6 | 20.3 | 9.3 | 7.4 | residual | residual | — | 17.4 |
| 7 | 47.1 | — | 19.7 | 4.5 | 14.3 | residual | residual | 4.9 | 12.2 |
| 8 | 47.1 | — | 19.7 | 4.5 | 14.3 | residual | residual | 10.9 | 27.2 |
| 9 | 53.2 | — | 22.3 | 10.2 | — | residual | 28.1 | — | 35.0 |
|   | 58.4 | — | 16.3 | 11.2 | — | residual | residual | | |
| 10 | 53.2 | — | 22.3 | 10.2 | — | residual | 39.1 | 2.0 | 14.1 |
|    | 38.7 | 9.6 | 20.3 | 9.3 | 7.4 | residual | residual | | |
| 11 | 38.7 | 9.6 | 20.3 | 9.3 | 7.4 | residual | 43.0 | 13.7 | 9.0 |
|    | 47.1 | — | 19.7 | 4.5 | 14.3 | residual | residual | | |
| 12 | 53.2 | — | 22.3 | 10.2 | — | residual | residual | — | 6.1 |
| 13 | 58.4 | — | 16.3 | 11.2 | — | residual | residual | 18.8 | 45.3 |
| 14 | 38.7 | 9.6 | 20.3 | 9.3 | 7.4 | residual | residual | — | 6.0 |
| 15 | 47.1 | — | 19.7 | 4.5 | 14.3 | residual | residual | 4.9 | 42.1 |
| 16 | 47.1 | — | 19.7 | 4.5 | 14.3 | residual | residual | — | — |
| 17 | 40.8 | — | 17.1 | 7.8 | 18.6 | residual | residual | 7.5 | — |

TABLE 4

| Specimen | T.C. Cal (cm · sec · degree) | Resistivity (ohm · cm) | Flexural strength (Kg/cm$^2$) | Critical Temp. (Kelvin) |
| --- | --- | --- | --- | --- |
| 1 | 0.20 | 10 × 10$^{-6}$ | 143 | 103 |
| 2 | 0.35 | 3 × 10$^{-6}$ | 127 | 73 |
| 3 | 0.10 | 25 × 10$^{-6}$ | 136 | 85 |
| 4 | 0.20 | 10 × 10$^{-6}$ | 150 | 88 |
| 5 | 0.10 | 20 × 10$^{-6}$ | 128 | 104 |
| 6 | 0.21 | 9 × 10$^{-6}$ | 133 | 103 |
| 7 | 0.13 | 17 × 10$^{-6}$ | 147 | 82 |
| 8 | 0.27 | 5 × 10$^{-6}$ | 125 | 75 |
| 9 | 0.40 | 2 × 10$^{-6}$ | 130 | 97 |
| 10 | 0.16 | 14 × 10$^{-6}$ | 135 | 95 |
| 11 | 0.09 | 22 × 10$^{-6}$ | 125 | 90 |
| 12 | 0.01 | 5 × 10$^{-3}$ | 63 | 100 |
| 13 | 0.45 | 2 × 10$^{-6}$ | 140 | 57 |
| 14 | 0.01 | 4 × 10$^{-3}$ | 70 | 97 |
| 15 | 0.45 | 2 × 10$^{-6}$ | 136 | 53 |
| 16 | 0.01 | 7 | 85 | 76 |
| 17 | 0.01 | 1 | 67 | 101 |

As will be understood from Table 4, the targets produced of the mixtures according to the present invention are improved in the thermal conductivity, the resistivity and the flexural strength in comparison with the targets produced of the mixtures out of the scope of the present invention. The targets of the present invention are thus increased in the thermal conductivity, so that the targets are effectively cooled off so as to prevent the targets from production of the cracks. This results in prolonging the service time of each target which in turn results in reduction of the production cost of the thin film. The resistivity is low enough to use the d.c. sputtering system, and this also is conducive to reduction of the production cost. The large flexural strength enhances the operability of each target, and the target is less liable to break. This further improves the production cost.

Comparing targets produced of the specimens 13 and 14 with the targets of the present invention, it is understood that no improvement is achieved in the thermal conductivity, the resistivity and the flexural strength. The targets produced of the specimens 12 and 15 suffer from the low critical temperatures, respectively. It is considered that the excess copper restricts the formation of the superconductive film.

Although particular embodiments of the present invention have been shown and described, it will be obvious to those skilled in the art that various changes and modifications may be made without departing from the spirit and scope of the present invention.

What is claimed is:

1. A solid target used in a sputtering system for forming a thin film of a quinary superconductive oxide, wherein said quinary superconductive oxide consists essentially of a thallium-barium-calcium-copper-oxide system or a bismuth-strontium-calcium-copper-oxide system, wherein said target is a quaternary complex oxide containing the elements of said quinary superconductive oxide and devoid of copper oxide with copper metal present between about 8% and about 40% by volume dispersed into said quaternary complex oxide throughout the target so as to be mixed into the quaternary complex oxide.

2. A solid target used in a sputtering system for forming a thin film of a quinary superconductive oxide, wherein said quinary superconductive oxide consists essentially of a thallium-barium-calcium-copper-oxide system or a bismuth-strontium-calcium-copper-oxide system, wherein said target is a quaternary complex oxide containing the elements of said quinary superconductive oxide and devoid of copper further contains copper metal present between about 8% and about 40% by volume, wherein said copper metal is dispersed into said quaternary complex oxide throughout the target so as to be mixed into the quaternary complex oxide, in which thallium, barium and calcium range from 29.1% by weight to 46.0% by weight, from 30.9% by weight to 39.0% by weight and from 10.4% by weight to 17.1% by weight, respectively, if said quinary superconductive oxide is in the thallium-barium-calcium-copper-oxide system, and in which bismuth, strontium and calcium range from 53.2% by weight to 58.4% by weight, from 16.3% by weight to 22.3% by weight and from 10.2% by weight to 11.2% by weight, respectively, if said quinary superconductive oxide is in the bismuth-strontium-calcium-copper-oxide system.

* * * * *